United States Patent [19]

Moffatt et al.

[11] Patent Number: 4,993,047
[45] Date of Patent: Feb. 12, 1991

[54] VOLTERRA LINEARIZER FOR DIGITAL TRANSMISSION

[75] Inventors: James P. Moffatt, Salem; Mitchell A. Skinner, Hampton, both of N.H.

[73] Assignee: AT&T Bell Laboratories, Murray Hill, N.J.

[21] Appl. No.: 402,750

[22] Filed: Sep. 5, 1989

[51] Int. Cl.$^5$ ............................................. H04L 27/38
[52] U.S. Cl. ....................................... 375/39; 375/101; 375/102
[58] Field of Search ....................... 375/39, 58, 59, 60, 375/67, 99, 101, 102, 12, 14, 15, 96, 103, 42; 370/20; 332/103, 104, 105, 123, 124, 144, 159, 160; 455/60, 91, 126, 303; 364/573; 329/304, 310

[56] References Cited

U.S. PATENT DOCUMENTS

| | | | |
|---|---|---|---|
| 3,906,401 | 9/1975 | Seidel | 332/159 |
| 4,462,001 | 7/1984 | Girard | 375/60 |
| 4,565,980 | 1/1986 | Ashida | 332/105 |
| 4,644,565 | 2/1987 | Seo et al. | 332/160 |
| 4,908,840 | 3/1990 | Kakimoto | 375/60 |
| 4,930,141 | 5/1990 | Ohmagari | 375/60 |

OTHER PUBLICATIONS

E. Biglieri et al., "Adaptive Cancellation of Nonlinear Intersymbol Interference for Voiceband Data Transmission", IEEE J. Select. Areas Commun., vol. SAC-2, No. 5, pp. 765–777, Sept. 1984.

H. Sari and G. Karam, "Cancellation of Power Amplifier Nonlinearities in Digital Radio Receivers", Proc., ICC-87, vol. 3, pp. 1809–1814, 1987.

J. Grabowski and R. C. Davis, "An Experimental M-QAM Modem Using Amplifier Linearization and Baseband Equalization Techniques", Proceedings, IEEE National Telecommunications Conference, 1982.

P. Vandamme and L. Bourgeade, "Performance of Adaptive Data Predistortion Applied to 2sup2N QAM Radio Systems", GLOBECOM '88, vol. 1, pp. 255–259, Nov. 1988.

Primary Examiner—Benedict V. Safourek

[57] ABSTRACT

Characterized nonlinearities in a QAM transmission channel are removed by this linearizer, in which selected bits from a sequence of received symbols on both rails form the address of a PROM. Stored values represent the Volterra expansion of the response of the channel, including the nonlinearity, to the symbol sequence. Symmetries in the Volterra expansion allow the same stored value to be used to correct both AM/AM same rail and AM/PM opposite rail distortion.

16 Claims, 5 Drawing Sheets

VOLTERRA LINEARIZER FOR DIGITAL TRANSMISSION

FIELD OF THE INVENTION

Digital transmission, and in particular, the correction of nonlinear distortion.

BACKGROUND OF THE INVENTION

As digital transmission rates increase to ever higher levels, the effects of distortion of all kinds become more serious. In digital radio transmission systems, for example, where quadrature amplitude modulation (QAM) is common, higher bit rates are accommodated by not only higher baud rates but also more analog levels for each symbol. It is obviously more difficult to accurately differentiate one level out of sixteen in a 256 QAM system than one level out of 4 in a 16 QAM system.

When the source of the distortion is linear, there are many known methods of providing correction, among the most effective being the digital transversal equalizer. When the distortion is nonlinear, however, the known digital equalizers being linear, provide inadequate improvement. Because the power amplifiers of radio systems generate substantial nonlinear distortion, special nonlinear analog circuits are often used to create a similar distortion which is then subtracted from the signal. Such analog circuits, however, require precise adjustment initially and readjustment with aging.

Attempts to provide nonlinear distortion correction with digital circuitry have to date been disappointing. Previous digital circuits fall into two broad categories, those that take into account the spreading of the signals over time as a result of limited transmission channel bandwidth, and those that do not. The circuits that do not, have limited performance as a result. The nonlinearity correction circuits that do account for time spreading have generally been too complex to implement in a practical way. For example, in "Cancellation of Power Amplifier Nonlinearities in Digital Radio Receivers", Proceedings, ICC-87, Volume 3, pages 1809-1814, H. Sari and G. Karam have described such a linearizer that takes into account only three symbols, yet needs 21 taps, 18 of which are nonlinear. To obtain the accuracy of a five symbol span, 35 taps would be required.

An object of this invention is a nonlinear digital linearizer that takes signal spreading into account, yet is simple and practical. Furthermore, it can readily be made adaptive to eliminate any need for manual adjustment.

SUMMARY OF THE INVENTION

Memory means, addressed by selected bits from a sequence of symbols on the I and Q rails of a QAM transmission channel produces two correction words. A first gain factor, multiplied by the first correction word, produces the AM/AM correction factor for the I rail, and multiplied by the second correction word, produces the AM/AM correction factor for the Q rail. A second gain factor, multiplied by the first correction word produces the AM/PM correction factor for the Q rail, and inverted and multiplied by the second correction word, the AM/PM correction factor for the I rail. The AM/AM and AM/PM correction factors are added to the respective rail portion of one symbol of the sequence.

The stored correction words may be the respective Volterra expansions of the response of the channel, including a characterized nonlinearity, to the symbol sequence.

DETAILED DESCRIPTION

Figure 1:
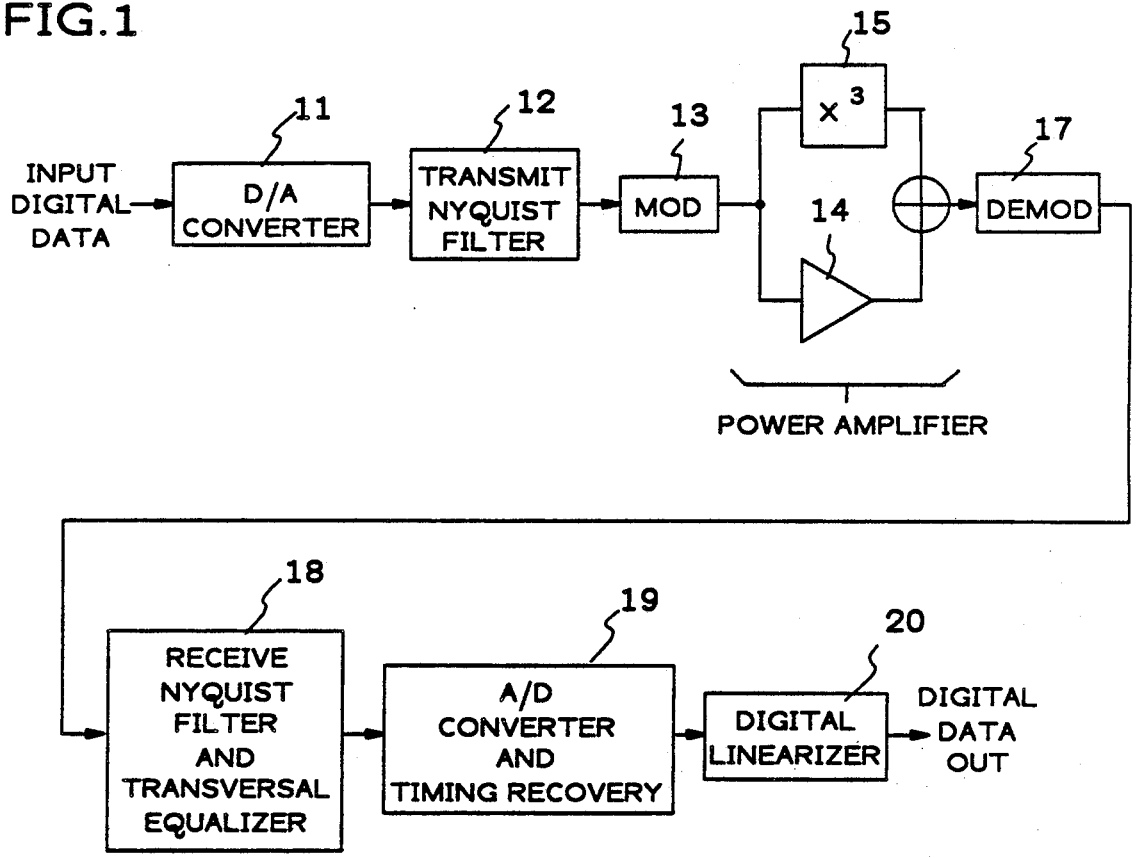
FIG. 1 is a block diagram of a digital radio system describing a useful application of the invention.

One very useful application of the linearizer of the invention is to correct the distortion generated by the power amplifier of a digital radio system. Such a system is shown in block form in FIG. 1, to which we now refer. In this more or less typical system the digital data signal to be transmitted is fed to a digital-to-analog (D/A) converter 11, where groups of bits forming symbols are converted to corresponding analog voltage levels to form a multilevel signal. A transmit Nyquist filter 12 provides half the linear signal shaping required to avoid intersymbol interference, and a modulator 13 places the shaped multilevel signal on a high frequency carrier for transmission. Typically, a QAM format is used for spectral efficiency.

In parallel with the power amplifier 14, and adding to its output is shown a source of third order distortion 15. This is the primary distortion generated by a traveling wave tube (TWT) amplifier. In a system using a solid state power amplifier, the distortion would be primarily fifth order, and would be shown in block 15 as $x^5$. The invention is not limited to either third or fifth order distortion. Any distortion that can be characterized mathematically can be accommodated.

In the receiver the signal is demodulated in a demodulator 17 and processed by a linear receive Nyquist filter and transversal equalizer in block 18 to reduce intersymbol interference and recover the baseband multilevel signal. Analog-to-digital (A/D) converter and timing recovery circuit 19 produces a digital signal that includes finer grain "soft" bits in addition to the received data bits. Finally, a digital linearizer 20, embodying our invention, removes the third order distortion introduced by the nonlinear transmitter amplifier to produce a corrected digital data stream output.

Figure 2:
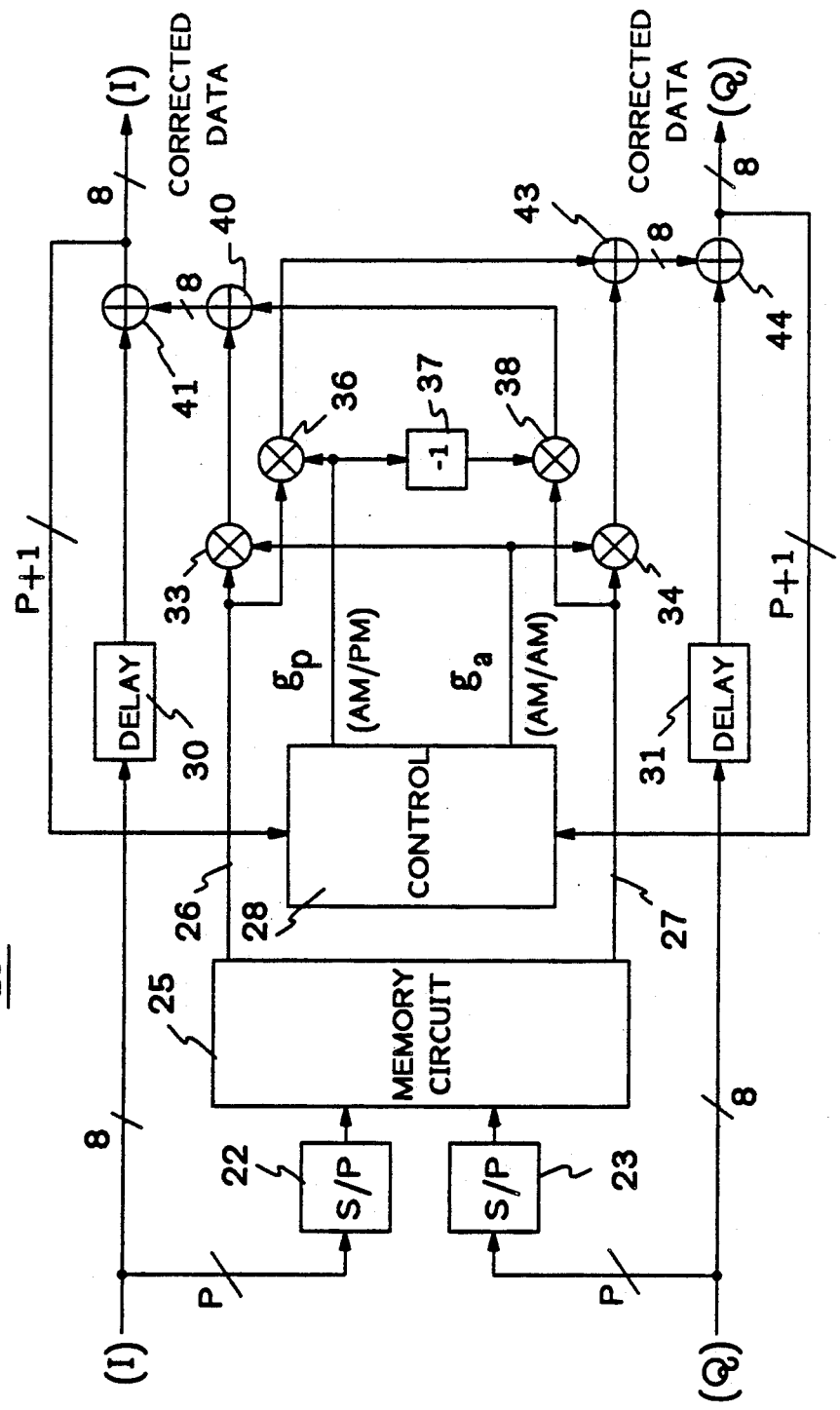
FIG. 2 is a block diagram of a particularly useful embodiment of the invention.

An embodiment of the invention that is particularly useful as linearizer 20 of FIG. 1 is shown in FIG. 2. This block diagram presupposes that the digital signal received from the A/D converter and timing recovery circuit 19 is on two rails, I and Q, and that each received analog symbol has been translated into more than the original data bits. 8-bit A/D conversion may be used, as an illustrative example, of which P bits are hard bits defining one of $2^P$ analog levels. The hard bit data from the I and Q rails consisting of P bits on each rail per symbol are fed to serial to parallel (S/P) converters 22 and 23, respectively, to produce a parallel word comprising selected bits from five successive symbols. In a 256 QAM system, P=4, and S/P 22 and 23 would each produce a parallel word comprising selected bits from five successive four-bit symbols, in 64 QAM, of course, P=3. The output words from S/P 22 and 23 form two address inputs to a memory circuit 25. Stored at each memory address is a normalized correction for the characterized distortion, in this case the third order distortion, to be applied to the center symbol represented by the five symbol address word. A control circuit 28, which may be adaptive, produces two gain factors, $g_a$ for amplitude modulation to amplitude modulation (AM/AM) distortion and $g_p$ for amplitude modulation to phase modulation (AM/PM) distortion.

Gain factor $g_a$ is fed to digital multipliers 33 and 34, and gain factor $g_p$ is fed to a digital multiplier 36 and to an inverter 37. The output of inverter 37 is fed to a digital multiplier 38. One output 26 of memory circuit 25 is fed to multipliers 33 and 36, and the other output 27 is fed to multipliers 38 and 34. The outputs of multipliers 33 and 38 are summed in a digital adder 40 and added in the digital adder 41 to the I rail signal. Similarly, the outputs of multipliers 34 and 36 are summed in an adder 43 and the sum added in an adder 44 to the Q rail signal. A pair of delay circuits 30 and 31 delay the signals on the I and Q rails, respectively, by the proper amount to cause adders 41 and 44 to add their corrections to the specific symbol that represented the center symbol of the respective address to memory circuit 25.

THEORY OF OPERATION

In a linear system we know that the Nyquist filters reduce to zero the effects of adjacent symbols upon the symbol we are detecting. With a nonlinearity, however, intersymbol interference is not zero and every symbol affects to some degree every other symbol. If we limit our consideration to a small number of symbols that are closest to the symbol we are detecting, we can define these effects. Considering a span of five symbols, we need only determine the distortion of the center symbol and the way in which the other symbols affect this distortion. Consider the following:

At the output of the QAM modulator, the continuous-time passband signal is:

$$s(t) = i(t)\cos(\omega_0 t) + q(t)\sin(\omega_0 t), \tag{1}$$

where i(t) and q(t) are the in-phase and quadrature baseband waveforms at the input to the modulator, and $\omega_0$ is the carrier radian frequency.

For the symbol occuring at t=0, the waveforms i(t) and q(t) can be approximated by:

$$i(t) = \sum_{n=-M}^{M} a_n h_t(t - nT), \tag{2a}$$

and $$q(t) = \sum_{n=-M}^{M} b_n h_t(t - nT), \tag{2b}$$

where $a_n$ and $b_n$ are the in-phase and quadrature data symbols and $h_t(t)$ is the transmitted pulse shape, and T represents the baud period.

For a cubic AM/AM transmitter nonlinearity, the nonlinear waveform at the output of the transmitter bandpass filter is:

$$a(t) = \tfrac{3}{4}\alpha_3[i^3(t) + i(t)q^2(t)]\cos(\omega_0 t) + \tfrac{3}{4}\alpha_3[q^3(t) + q(t)i^2(t)]\sin(\omega_0 t), \tag{3}$$

where $\alpha_3$ is the real part of the third order nonlinearity. At the output of the QAM demodulator (but before the receive Nyquist filter) the nonlinear waveforms become:

$$a_i(t) = \tfrac{3}{4}\alpha_3[i^3(t) + i(t)q^2(t)], \tag{4a}$$

and $$a_q(t) = \tfrac{3}{4}\alpha_3[q^3(t) + q(t)i^2(t)], \tag{4b}$$

where the subscripts i and q represent the in-phase and quadrature rails.

Neglecting the factor $\tfrac{3}{4}$ and assuming $\alpha_3 = 1$, the normalized i-rail distortion becomes:

$$a_i(t) = \left[\sum_{n=-M}^{M} a_n h_t(t - nT)\right]^3 + \left[\sum_{n=-M}^{M} a_n h_t(t - nT)\right]\left[\sum_{n=-M}^{M} b_n h_t(t - nT)\right]^2 \tag{5}$$

which is obtained by substituting (2a) and (2b) into (4a).

The modem receiver functions (Nyquist filter and sampling) are modeled by the equation:

$$R_{i0} = \int_{-\infty}^{\infty} h_r(\tau) a_i(-\tau) d\tau, \tag{6}$$

where $R_{i0}$ represents the i-rail nonlinear response at time t=0, and $h_r(t)$ is the impulse response of the receive Nyquist filter.

Substitution of (5) into (6) gives:

$$R_{i0} = \int_{-\infty}^{\infty} h_r(\tau)\left[\left[\sum_{n=-M}^{M} a_n h_t(-\tau - nT)\right]^3 + \left[\sum_{n=-M}^{M} a_n h_t(-\tau - nT)\right]\left[\sum_{n=-M}^{M} b_n h_t(-\tau - nT)\right]^2\right]d\tau, \tag{7}$$

as the expression for the normalized correction of the third order nonlinearity to be stored in the first part of the memory.

A similar derivation of the AM/AM correction for the q-rail yields:

$$R_{q0} = \int_{-\infty}^{\infty} h_r(\tau)\left[\left[\sum_{n=-M}^{M} b_n h_t(-\tau - nT)\right]^3 + \left[\sum_{n=-M}^{M} b_n h_t(-\tau - nT)\right]\left[\sum_{n=-M}^{M} a_n h_t(-\tau - nT)\right]^2\right]d\tau, \tag{8}$$

as the expression for the normalized correction of the third order nonlinearity to be stored in the second part of the memory.

A similar derivation of the AM/PM correction for the i-rail yields:

$$P_{i0} = -\int_{-\infty}^{\infty} h_r(\tau)\left[\left[\sum_{n=-M}^{M} b_n h_t(-\tau - nT)\right]^3 + \tag{9}$$

-continued $$\left[\sum_{n=-M}^{M} b_n h_t(-\tau - nT)\right]\left[\sum_{n=-M}^{M} a_n h_t(-\tau - nT)\right]^2 \right\} d\tau,$$

as the expression for the normalized correction. This expression is fortuitously equal to the negative of equation (8), and thus the second part of the memory can also be used for this correction.

A similar derivation of the AM/PM correction for the q-rail yields:

$$P_{q0} = \int_{-\infty}^{\infty} h_r(\tau) \left\{\left[\sum_{n=-M}^{M} a_n h_t(-\tau - nT)\right]^3 + \right. \tag{10}$$

$$\left[\sum_{n=-M}^{M} a_n h_t(-\tau - nT)\right]\left[\sum_{n=-M}^{M} b_n h_t(-\tau - nT)\right]^2 \right\} d\tau,$$

as the expression for the normalized correction. This expression is fortuitously equal to equation (7), and thus the first part of the memory can also be used for this correction.

From FIG. 1 it can be seen that the nonlinear response of the radio transmitter is first operated on by the adaptive linear circuits in the modem receiver. These circuits respond to the nonlinearity since it has embedded linear effects. For example, cubic expansion increases the mean signal gain. From equations (4a) and (4b), it is observed that the corrections stored in the memory are correlated with the same-rail signal since the cross-rail signal occurs only as a square.

If the linearizer is to operate as a stand-alone device which follows the transversal equalizer and other adaptive linear circuits, the corrections stored in the memory should have no embedded linear effects. To achieve this result, the following modifications are applied to the corrections.

For each symbol position, the conditional mean correction for positive same-rail signal levels is made to equal the conditional mean correction for negative same-rail signal levels. The equal-mean conditions are obtained by subtracting a linear function of each same-rail signal level from the original, purely cubic, corrections. These modifications model the response of the correlated-error-polarity algorithms used in the modem receiver adaptive linear circuits. As a result of the memory modifications, it is possible to implement the linearizer as a stand-alone circuit in the modem receiver. With this feature the linearizer can be developed as a separate circuit with no interaction with the transversal equalizer and other receiver adaptive circuits. The modifications are not required if the linearizer is used in the modem transmitter or if it is included within the feedback loops which control the adaptive linear circuits in the modem receiver.

The final step in programming the memory is to scale the previously calculated results so that they do not exceed the range of values that can be stored in the memory locations.

Since there are three significant bits per symbol in a 64 QAM system, and two rails, to fully implement these corrections directly in memory considering a span of five symbols would require addresses which are thirty bits long. Considering both AM/AM and AM/PM distortion this requires about one billion bytes of memory for each rail. By judiciously selecting a subset of the data bits of the symbol sequence to approximate the effect of the thirty data bits that make up the five symbols on both rails, however, we can effect a very substantial memory reduction.

In the 64 QAM case we have obtained excellent results by considering only fourteen address bits, starting with the sixteen bits selected according to the following table:

| Significant Data Bits For Reduced-Size Memory | | | | | |
|---|---|---|---|---|---|
| | $S_{-2}$ | $S_{-1}$ | $S_0$ | $S_1$ | $S_2$ |
| Same-rail Signal | 1 | 3 | 3 | 3 | 1 |
| Cross-rail Signal | 0 | 1 | 3 | 1 | 0 |

In the cases where only one of the three data bits is used, the sign or most significant bit is retained. If the sign is a zero, the possible transmitted data levels 1,3,5 and 7 may be approximated in calculating the memory contents by 5.57 which produces the midpoint correction for a cubic nonlinearity with input limits of 1 and 7. If the sign bit is a one, the possible transmitted data levels $-1$, $-3$, $-5$ and $-7$ may be approximated by $-5.57$ which produces the midpoint correction for a cubic nonlinearity with input limits of $-1$ and $-7$. These values were found to provide excellent cancellation of the nonlinearity.

We have realized that there are several properties of the nonlinear response of a band limited transmission channel which allow us to significantly reduce the memory still further.

First, the AM/AM same rail distortion is the same function as the AM/PM opposite-rail distortion.

Second, the distortion is an odd function of the same rail input signal.

Finally, the distortion is an even function of the cross-rail input signal. Each of these facts allows us, with the use of some logic, to take advantage of the implied symmetries to reduce the memory by half, yielding a total improvement of a factor of eight.

These combined measures allow memory circuit 25 to contain only two Volterra memory units, each in the 64 QAM case with only fourteen address bits and $2^{14}$, or approximately 16k bytes.

The first mentioned reduction in address bits may be conveniently handled in S/P 22 and 23. Each S/P may comprise three shift registers, five bits long, one for each of the three respective bits of a symbol. As each new symbol is entered, the previous symbols are shifted down. An eleven-bit output bus is connected to the eleven selected bits of the first row of Table 1. All three bits of the center symbol $s_0$ and the two adjacent symbols $s_1$ and $s_{-1}$, and only the most significant, or sign bit, of the two end symbols $s_2$ and $s_{-2}$ are fed via the eleven-bit bus to memory circuit 25.

Figure 3:
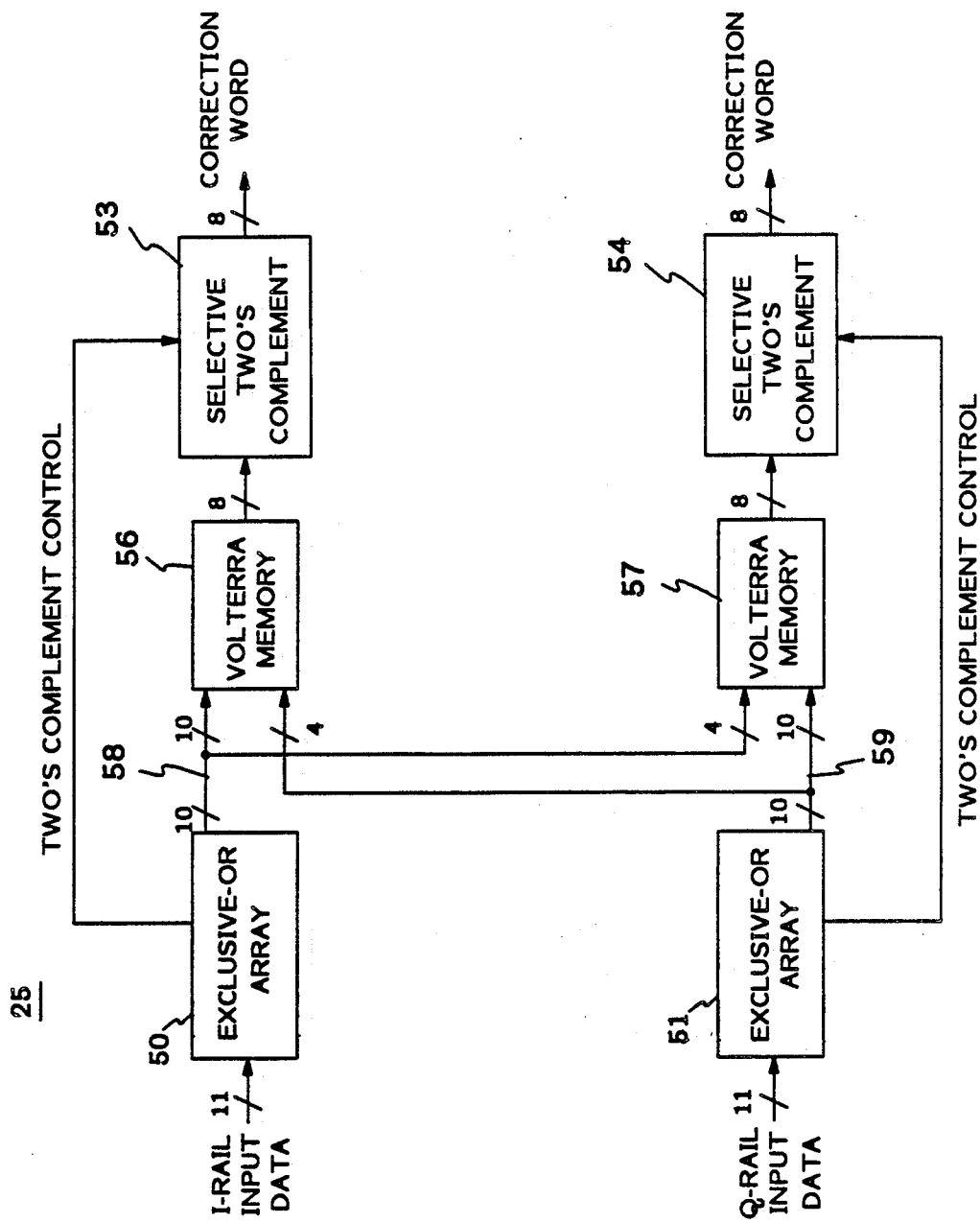
FIG. 3 is a block diagram of the memory circuit of the embodiment of FIG. 2.

The further reduction in memory can be explained with reference to FIG. 3, which is a block diagram of a memory circuit useful as memory circuit 25. In FIG. 3 the eleven bits illustrated by the second line of Table 1, which are needed to generate the memory address are fed from S/P 22 to exclusive-OR logic array 50 and from S/P 23 to exclusive-OR array 51. Since the two rails are identical, the I rail will be described.

Exclusive-OR array 50 separates the most significant bit, that is, the sign bit of the center symbol $s_0$ and sends it to the selective two's-complement circuit 53. If that bit is a 1, indicating a negative voltage level, exclusive-OR array 50 inverts the remaining ten input bits before sending them to Volterra memories 56 and 57. If the most significant bit of the center symbol is zero, the ten other input bits are passed to memories 56 and 57 unchanged. The ten bit bus 58 that connects the exclusive-OR array to the Volterra memory 56 contains a tap that feeds four bits of the five shown on line 3 of Table 1, to the opposite rail memory. Because of the even symmetry of the cross-rail term, the center sign bit is not needed. The other two bits from $s_0$ and the most significant bits from $s_1$ and $s_{-1}$, therefore, form the cross-rail address of memory 57. The eight-bit word retrieved from memory 56 forms the other input of selective two's-complement circuit 53. When the control bit, that is, the sign bit of $s_0$, which forms the first input to selective two's-complement circuit 53 is zero, the eight-bit word from memory 56 is output unchanged. When the control bit is 1, on the other hand, circuit 53 performs a two's-complement operation on the eight-bit input word to form the normalized correction output word.

The correction that we have obtained to this point takes into account the characterized distortion and the characteristics of the transmission channel. It does not, however, take into account the distortion amplitude. All distortion in a transmission system can be characterized as AM/AM or AM/PM, and the amount of distortion of each type may be very different. We therefore need a gain control for each type correction. Since as we have already recognized, however, the AM/AM same rail distortion is the same function as the AM/PM opposite rail distortion, each of the outputs of memory circuit 25 contains the correction factors for AM/AM distortion on one rail and AM/PM distortion on the other. Control circuit 28, which has two outputs, and the network of multipliers and adders connected to them allow us to apply these corrections properly.

A QAM signal is often represented in a two-dimensional array known as a phase plane in which the x and y coordinates represent the analog signal levels on the I and Q rails, respectively. Since the data symbols are represented by discrete analog levels, the phase plane as seen on an oscilloscope or x-y plotter should be a square grid of evenly spaced dots. AM/AM distortion is evidenced on the phase plane as a nonlinear expansion. Control circuit 28 variable gain output $g_a$ therefore, which is applied to both rails through multipliers 33 and 34, respectively, can be adjusted to generate an evenly spaced dot pattern.

AM/PM distortion is evidenced on the phase plane as a nonlinear rotation. This requires a correction on one rail of opposite polarity from the other rail. To accommodate this the other output of control circuit 28, variable AM/PM gain $g_p$, is applied directly via multiplier 36 to rail Q, but inverted by inverter 37 and applied via multiplier 38 to rail I. Again, $g_p$ may be adjusted to produce a square grid of uniformly spaced dots on the phase plane. Alternatively, both gains $g_a$ and $g_p$ may be adjusted to produce the lowest output error rate.

In this embodiment, the gain factors may be in the form of eight-bit digital words, the multipliers and adders also being digital. Control circuit 28 therefore produces two independently adjustable eight-bit words.

Figure 4:
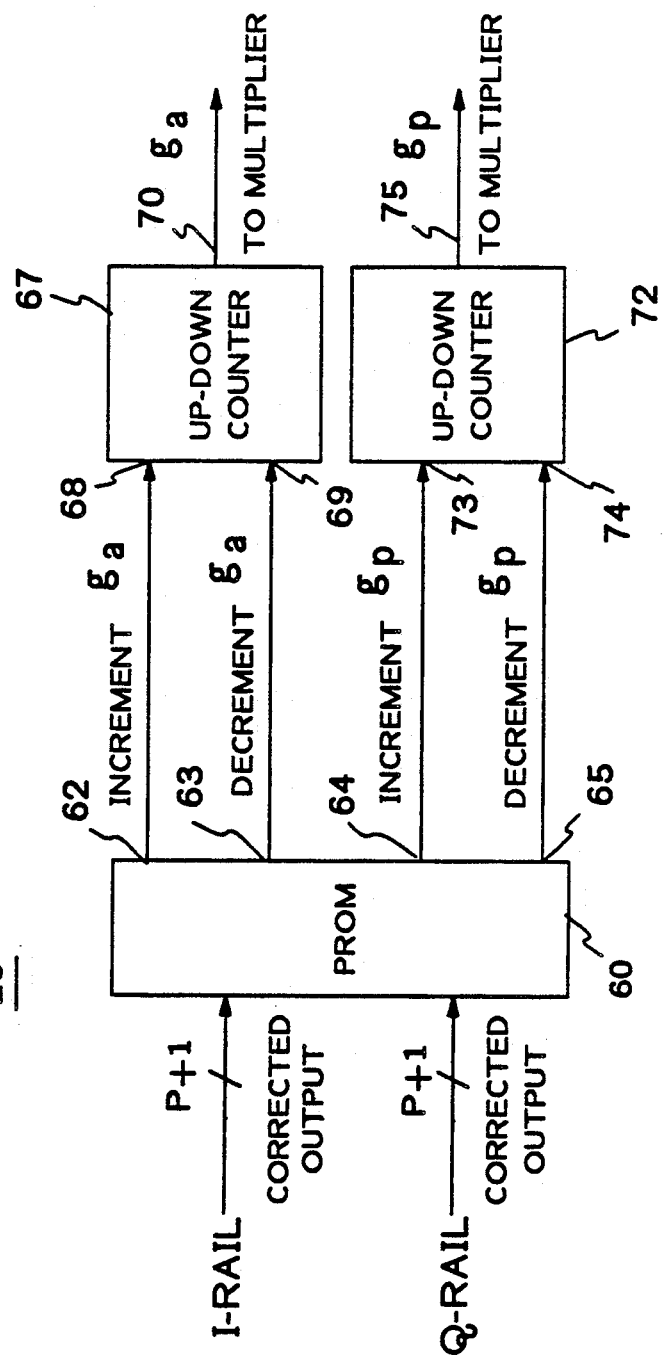
FIG. 4 is a block diagram of the adaptive control circuit of the embodiment of FIG. 2.

With the judicious use of feedback from the corrected output data, control circuit 28 can be made adaptive. Such an embodiment is shown in FIG. 4. In this circuit, the P+1 most significant bits of each corrected output symbol from the corrected data on the two rails form the address of a programmed read-only memory (PROM) 60. The P+1 bits include the P data bits and the most significant soft bit, which indicates the polarity of the implicit error. Stored at each address in PROM 60 may be a four bit word, which is output in parallel form on outputs 62 through 65, respectively. An up-down counter 67 has an increment input 68 connected to PROM output 62, a decrement input 69 connected to PROM output 63 and a $g_a$ output 70.

A second up-down counter 72 has an increment input 73 connected to PROM output 64, a decrement input 74 connected to PROM output 65 and a $g_p$ output 75. The counts stored in counter 67 and 72 are in fact the gain values $g_a$ and $g_p$, respectively.

Figure 5:
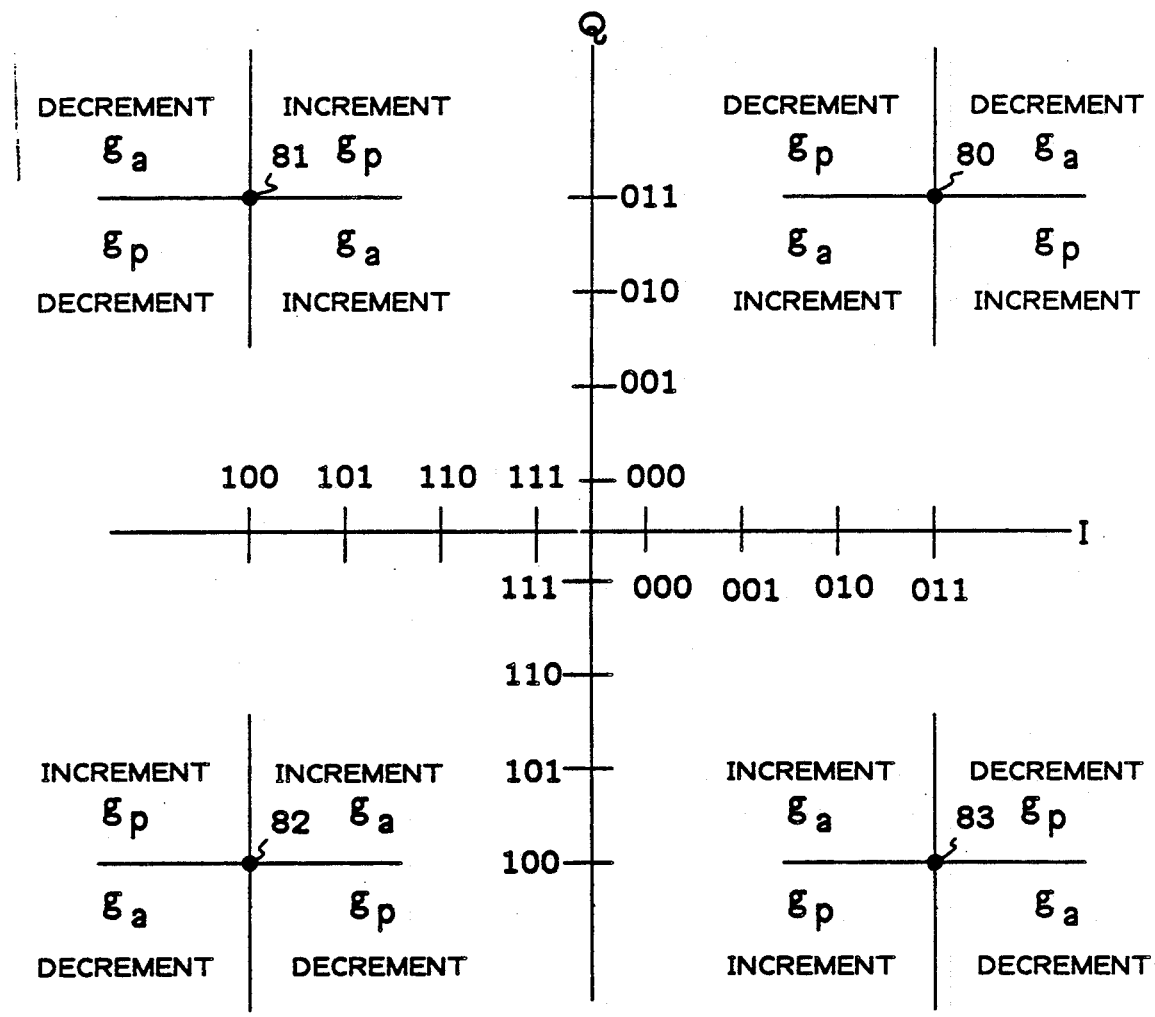
FIG. 5 is a 64 QAM phase plane diagram useful in explaining the operation of the adaptive control circuit of FIG. 4.

To understand the programming of PROM 60 and therefore the operation of the adaptive control circuit consider the phase plane diagram of FIG. 5. In this drawing the corner states are shown by points 80 through 83. These are the four states represented by maximum magnitude symbols on both rails. The area around each corner state is divided into four local quadrants. The error polarity bits of the symbols that constitute the corner states determine which local quadrant the signal falls into. Since these four states are most affected by the nonlinearities and since the variations to be accommodated by the adaptive circuit are relatively long term, we need to use only the information from these four states to control our gains.

Once a corner state is detected, the error polarity bits are used to determine the type of nonlinearity present and the adjustment direction needed to correct it. The quadrants of the corner states that lie on the diagonals of the phase plane represent nonlinear compression or expansion, and therefore indicate adjustment of $g_a$. For example, a baud in which the four most significant bits on the I and Q rails are 0110 and 0110, respectively, falls in quadrant 3 of phase state 80. This indicates that the adaptive circuit should increment $g_a$ in order to reduce the error. Stored at the address 01100110 of PROM 60, therefore, is the word 1000 providing an increment pulse to counter 67. Similarly, at the address 1000 0111, representing the second quadrant of state 81, is the word 0100, which operates to decrement counter 67.

The other quadrants of the corner states represent nonlinear rotation, and therefore indicate adjustment of $g_p$. Stored at address 1001 1000, which falls in the fourth quadrant of state 82, therefore is the word 0001, providing a decrement pulse to counter 72 and more clockwise rotation of the phase plane periphery. The thirteen remaining corner state addresses are programmed in a similar manner. All other addresses that do not represent corner states can be programmed with 0000, indicating no gain adjustment.

With this adaptive control circuit, $g_a$ and $g_p$ are continually adjusted every time a corner state appears to provide an equal number of ones and zeros in the corner state error polarity bits, and therefore maximum corner state accuracy. It will be obvious that the corner states are not the only states in the phase plane that can provide effective feedback for the adaptive circuit. The error polarity bits of any state would provide some adaptive improvement, those further from the origin being the most effective. It will also be obvious that with such a small number of states being used, the adaptive control can be designed to the same algorithm using logic instead of a PROM.

A linearizer of the embodiment described, for removing third order distortion in a 64 QAM digital radio system operating in the 4 GHz frequency band at 90 mb/s has proven to be very effective, improving the error rate due to TWT nonlinearity by five orders of magnitude.

It will be readily understood that the invention can be practiced at other QAM levels and using other media than radio. A designer can adjust the size of the Volterra memory, the number and selection of bits in the address, etc. to suit the application. Further, fifth order distortion generated by solid state power amplifiers, or in fact any nonlinear distortion which can be characterized and convolved with the expression of the transmission channel as taught herein can be corrected according to our invention.

It will also occur to those skilled in the art that it is possible to use our invention advantageously in the transmitter as a predistorter. In the predistorter configuration, since the addresses to the Volterra memories are selected bits from the uncorrupted signal, the accuracy will be slightly greater. To provide the adaptive feature in either case, however, a narrow communication channel from the receiver is needed to provide the necessary feedback.

We claim:

1. A digital linearizer (20) for reducing the intersymbol interference due to a characterized nonlinearity in a QAM transmission channel in which data symbols comprise a combination of p bits on an I rail and p bits on a Q rail comprising:
    address means (22, 23) connected to said I and Q rails for forming at least one address from a sequence of n of said data symbols;
    memory means (26) connected to said address means for producing first and second correction words in response to said address; and
    correcting means (28-44) connected to said memory means and said I and Q rails for generating and adding to the Q rail portion of one of the symbols of said sequence a first AM/AM correction factor that is the product of a first gain factor $g_a$ and said second correction word and a first AM/PM correction factor that is the product of a second gain factor $g_p$ and said first correction word and for generating and adding to the I rail portion of said one symbol of said sequence a second AM/AM correction factor that is the product of said first gain factor and said first correction word and a second AM/PM correction factor that is the negative of the product of said second gain factor and said second correction word.

2. A digital linearizer, as in claim 1, wherein said first correction word comprises the Volterra expansion of the AM/AM I rail response to said sequence of said transmission channel including said characterized nonlinearity, and said second correction word comprises the Volterra expansion of the AM/AM Q rail response to said sequence of said transmission channel including said characterized nonlinearity.

3. A digital linearizer, as in claim 2 wherein said one symbol is the center symbol of said sequence.

4. A digital linearizer, as in claim 2, wherein said address means forms first and second addresses, each address comprising a respective subset of the bits of said symbols from both rails, and wherein said first correction word is produced in response to said first address and second correction word is produced in response to said second address.

5. A digital linearizer, as in claim 4, wherein said transmission channel is 64QAM, n=5, p=3 and said first address comprises from the I rail portion of said sequence, three bits each from the second, third and fourth symbols, and the sign bit from each of the first and last symbols, and from the Q rail portion of said sequence, three bits from the third symbol, and the sign bit from each of the second and fourth symbols.

6. A digital linearizer, as in claim 4, wherein the relative symbol magnitude used in generating said first correction word for each symbol represented by only one bit in said first address is that which produces the midpoint correction for said characterized nonlinearity.

7. A digital linearizer, as in claim 5, wherein said characterized nonlinearity is third order distortion, the allowable relative magnitudes of said symbols are 1, 3, 5, and 7 and the relative magnitude used in calculating said correction words is approximately 5.57 for the I rail portion of the first and last symbols and the Q rail portion of the second and fourth symbols of said sequence.

8. A digital linearizer, as in claim 4, wherein said memory means comprises first and second PROM units (56, 57); and said address means comprises:
    first and second shift register means (22, 23) connected to said I and Q rails, respectively, said shift register means each comprising $n \times p$ cells for accumulating the p bits of each of the n most recent symbols;
    first bus means connected from a first subset of the cells of both of said shift register means to said first PROM unit to generate said first address; and
    second bus means connected from a second subset of the cells of both of said shift registers means to said second PROM unit to generate said second address.

9. A digital linearizer, as in claim 4, wherein said memory means comprises first and second memory units; and
    said address means comprises first and second address units, each of said address units comprising:
    shift register means (22, 23) connected to a respective rail (I, Q), said shift register means comprising $n \times p$ cells for accumulating the p bits of each of the n most recent symbols to form the respective portion of said sequence of symbols;
    first bus means connected to a first subset of said $n \times p$ cells to produce a parallel word comprising the center symbol sign bit and a plurality of other bits of said symbol sequence portion; and
    a logic array (50, 51) connected to said bus means and responsive to said center symbol portion sign bit for producing an output word;
    said output word comprising said plurality of other bits when said center symbol portion is positive and the inverse of said other bits when said center symbol portion is negative;
    said address means further comprising second bus means connecting said output word from said first address unit and selected bits from said output word from said second address unit to said first memory unit to form said first address; and
    third bus means connecting said output word from said second address unit and selected bits from said output word from said first address unit to said second memory unit to form said second address.

10. A digital linearizer, as in claim 9, wherein said first and second memory units each comprise:
   a read-only memory (56, 57) for producing a stored word in response to said respective address; and
   a selective two's complement circuit (53, 59) connected to said respective read-only memory and said respective logic array (50, 51) and responsive to said respective center symbol sign bit for producing said respective correction word;
   said respective correction word comprising said stored word when said center symbol portion is positive and the two's complement of said stored word when said center symbol portion is negative.

11. A digital linearizer, as in claim 9 wherein said first address comprises from the I rail portion of said sequence, the sign bit only from the first and last symbols and all data bits except the sign bit from the center symbol and, from the Q rail portion of said sequence, all data bits except the sign bit from the center symbol.

12. A digital linearizer, as in claim 4 wherein said correcting means comprises:
   first gain means (67) for producing an adjustable AM/AM gain word $g_a$;
   second gain means (72) for producing an adjustable AM/PM gain word $g_p$;
   first digital multiplying means (33) connected to said first gain means and said memory means for multiplying said first correction word by said AM/AM gain word to produce said second AM/AM correction factor;
   second digital multiplying means (34) connected to said first gain means and said memory means for multiplying said second correction word by said AM/AM gain word to produce said first AM/AM correction factor;
   third digital multiplying means (36) connected to said second gain means and said memory means for multiplying said first correction word by said AM/PM gain word to produce said first AM/PM correction factor;
   inverting means (37) connected to said second gain means for producing a negative AM/PM gain word;
   fourth digital multiplying means (38) connected to said inverting means and said memory means for multiplying said second correction word and said negative gain word to produce said second AM/PM correction factor;
   first adding means (40+41) connected to said first and fourth digital multiplying means and said I rail for adding said second correction factors to said I rail portion of said one symbol of said sequence; and
   second adding means connected to said second and third digital multipliers and said Q rail for adding said first correction factors to the Q rail portion of said one symbol of said sequence.

13. A digital linearizer, as in claim 12, wherein said symbols comprise, at the linearizer output, p data bits and one soft bit on each of said rails, said soft bits indicating the error polarity of said respective symbol rail portions, said linearizer further comprising:
   adaptive control means (28) responsive to said data bits and soft bits and connected to said first and second gain means;
   said control means operating to:
   increment said AM/AM gain word in response to a combination of data bits and soft bits of a symbol indicative of nonlinear compression of the symbol phase plane;
   decrement said AM/AM gain word in response to a combination of data bits and soft bits of a symbol indicative of nonlinear expansion of said phase plane;
   increment said AM/PM gain word in response to a combination of data bits and soft bits of a symbol indicative of nonlinear clockwise rotation of said phase plane; and
   decrement said AM/PM gain word in response to a combination of data bits and soft bits of a symbol indicative of nonlinear counter-clockwise rotation of said phase plane.

14. A digital linearizer, as in claim 13, wherein said first and second gain means comprise respective up-down counters (67, 72); and
   said adaptive control means comprises PROM means (60) addressed by said data bits and soft bits of said output symbols and connected to said up-down counters, said PROM means having stored therein at addresses representative of corner state symbols of said phase plane, instruction words for altering the count of said counters.

15. A digital linearizer, as in claim 4, wherein said correction factors are added to said symbols at the transmitter of said QAM transmission channel.

16. A digital linearizer, as in claim 4, wherein said correction factors are added to said symbols at the output of said digital linearizer.

* * * * *